(12) United States Patent
Mohseni et al.

(10) Patent No.: US 7,376,319 B2
(45) Date of Patent: May 20, 2008

(54) VERTICALLY COUPLED LARGE AREA AMPLIFIER

(75) Inventors: Hooman Mohseni, Princeton, NJ (US); Joseph H. Abeles, East Brunswick, NJ (US); Martin H. Kwakernaak, New Brunswick, NJ (US); Viktor Borisovitch Khalfin, Hightstown, NJ (US)

(73) Assignee: Sarnoff Corporation, Princeton, NJ (US)

( * ) Notice: Subject to any disclaimer, the term of this patent is extended or adjusted under 35 U.S.C. 154(b) by 138 days.

(21) Appl. No.: 11/002,403

(22) Filed: Dec. 2, 2004

(65) Prior Publication Data

US 2005/0147356 A1 Jul. 7, 2005

Related U.S. Application Data

(60) Provisional application No. 60/526,172, filed on Dec. 2, 2003.

(51) Int. Cl.
*G02B 6/10* (2006.01)

(52) U.S. Cl. ............ 385/131; 385/129; 385/130; 385/132

(58) Field of Classification Search ......... 385/129–132
See application file for complete search history.

(56) References Cited

U.S. PATENT DOCUMENTS

| 3,899,235 A | 8/1975 | Arnoud et al. | |
|---|---|---|---|
| 5,140,149 A * | 8/1992 | Sakata et al. | 257/436 |
| 5,220,573 A * | 6/1993 | Sakata et al. | 372/50.21 |
| 2002/0051615 A1 | 5/2002 | Walpole et al. | |

* cited by examiner

*Primary Examiner*—Frank G. Font
*Assistant Examiner*—Derek L. Dupuis
(74) *Attorney, Agent, or Firm*—Lowenstein Sandler PC

(57) ABSTRACT

A monolithic light amplification system including: an un-doped waveguide; a ridge waveguide positioned over the un-doped waveguide; and, at least a doped layer between the un-doped waveguide and ridge waveguide; wherein, the un-doped waveguide and ridge waveguide cooperate to amplify light input to the un-doped waveguide.

15 Claims, 5 Drawing Sheets

Far - field

Near - field

VERTICALLY COUPLED LARGE AREA AMPLIFIER

RELATED APPLICATIONS

This Application claims priority of U.S. patent application Ser. No. 60/526,172, filed Dec. 2, 2003, entitled VERTICALLY COUPLED LARGE AREA AMPLIFIER (VECLAA), the entire disclosure of which is hereby incorporated by reference as if being set forth in its entirety herein.

GOVERNMENT LICENSE RIGHTS

The invention was made with U.S. government support, and the U.S. Government has certain rights in the invention, as provided for by the terms of Contract number MDA972-03-C-0043 (DARPA) awarded by the U.S. Army Research Laboratory.

FIELD OF INVENTION

The present invention relates generally to optical systems and amplifiers.

BACKGROUND OF THE INVENTION

The amplification of optical signals is known to be important. High power optical amplification is useful in telecommunications and ablation applications, both by way of non-limiting example only. It is believed to be desirable to achieve faithful amplification powers of optical signals of about 500 watts or more, also by way of non-limiting example.

The principles of the transmission of optical signals via optical fibers are well understood. In deed, optical fibers are used to transmit light in many conventional applications. It is also believed to be desirable to provide a high power optical amplifier that is well-suited for use with optical fibers—in addition to other types of optical waveguides as well.

SUMMARY OF INVENTION

A monolithic light amplification system including: an un-doped waveguide; a ridge waveguide positioned over the un-doped waveguide; and, at least a doped layer between the un-doped waveguide and ridge waveguide; wherein, the un-doped waveguide and ridge waveguide cooperate to amplify light input to the un-doped waveguide.

BRIEF DESCRIPTION OF THE FIGURES

Understanding of the present invention will be facilitated by consideration of the following detailed description of the preferred embodiments taken in conjunction with the accompanying drawings, wherein like numerals refer to like parts and.

DETAILED DESCRIPTION OF THE PREFERRED EMBODIMENTS

It is to be understood that the figures and descriptions of the present invention have been simplified to illustrate elements that are relevant for a clear understanding of the present invention, while eliminating, for purposes of clarity, many other elements found in typical optical systems and methods of making and using the same. Those of ordinary skill in the art will recognize that other elements are desirable and/or required in order to implement the present invention. However, because such elements are well known in the art, and because they do not facilitate a better understanding of the present invention, a discussion of such elements is not provided herein.

Figure 1:
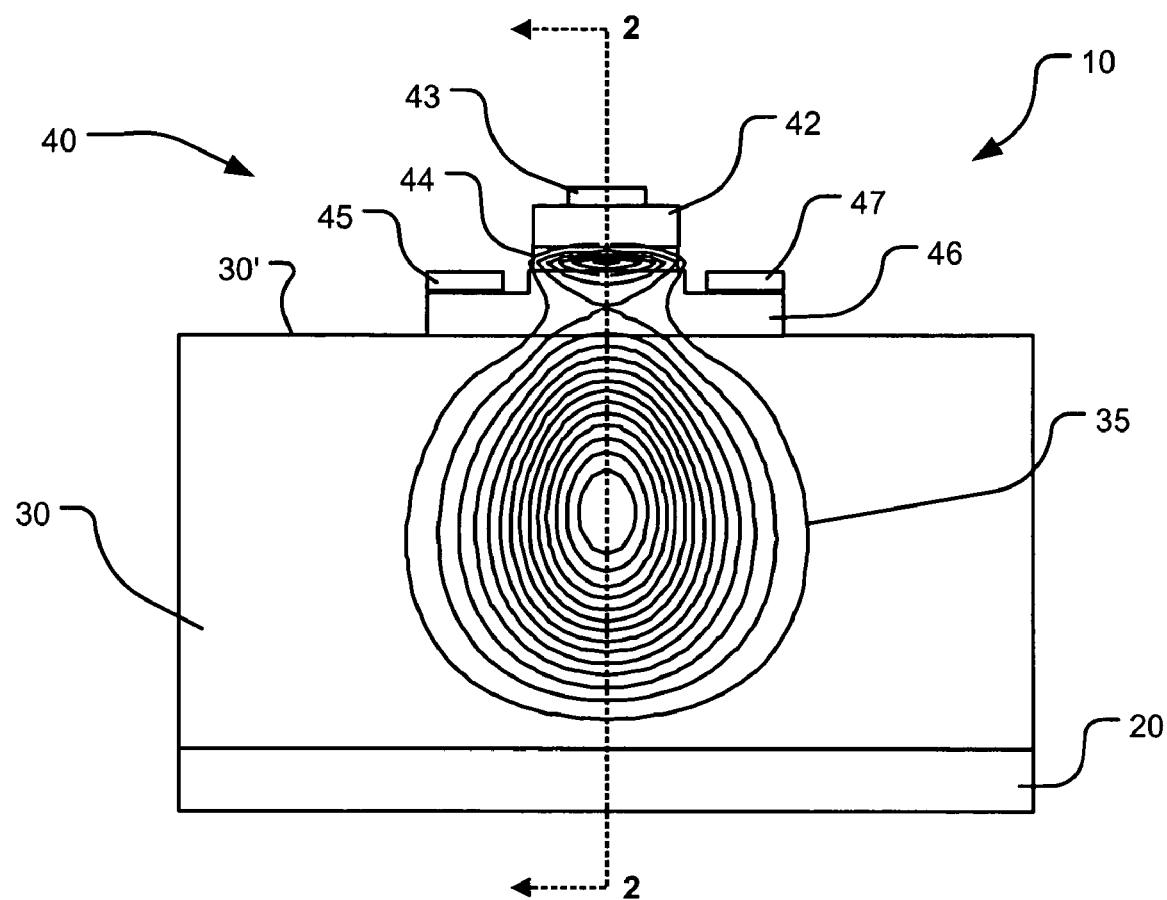
FIG. 1 illustrates a diagrammatic view of a system according to an aspect of the present invention.

Referring now to FIG. 1, there is shown a diagrammatic representation of an amplifier system 10 according to an aspect of the present invention. Amplifier 10 generally includes a substrate 20, amplification/guiding region 30 and waveguide region 40. Amplifier system 10 may be monolithic in nature. Amplifier system 10 may be used with other photonic components as part of a photonic integrated circuit and/or in combination with non-monolithic components, such as optical fiber. For example, amplifier system 10 may be provided alone, in combination with other amplifiers, or in combination with other photonic components, such as sources like lasers, or photonic switches, all by way of non-limiting example only.

Substrate 20 may take the form of any suitable optical system substrate suitable for use with other materials found in the system. Substrate 20 provides a structural base upon which the regions 30, 40 may be supported, for example. Substrate 20 may be composed of GaAs, by way of non-limiting example only.

Region 30 serves as a primary propagation and amplification region during operation. Region 30 may be composed of one or more waveguiding materials suitable for use with other materials found in the system. For example, region 30 may be composed of AlGaAs. According to an aspect of the present invention, region 30 may he undoped. According to an aspect of the present invention, region 30 may be composed of undoped ALGaAs. According to an aspect of the present invention, the cross-sectional area of region 30 may be large compared to the active layer of waveguiding region 40, and devoid of quantum well structure. Region 30 is vertically, optically coupled to region 40, such that activation of region 40 serves to amplify optical signals in region 30.

Region 40 may take the form of a ridge waveguide structure including an active layer sandwiched between cladding layers. For example, region 40 may include quantum well(s) in a layer 44 sandwiched between an upper cladding 42 and a lower cladding 46. By way of further example, quantum well(s) layer 44 may take the form of a single quantum well (SQW) structure or multi-quantum well (MQW) structure. Quantum well(s) layer 44 may be composed of any suitable material system, such as one including InGaAs/GaAs, by way of non-limiting example only. Upper cladding 42 may take the form of a suitable cladding material for use with layer 44, such as p-AlGaAs. Lower cladding 46 may also take the form of a suitable cladding material for use with layer 44, such as n-AlGaAs. Contact 43 may be provided for upper cladding layer 42. Contacts 45 and 47 may be provided for lower cladding layer 46. In one configuration, contact 43 may provide a p-contact for region 40, while contacts 45, 47 provide n-contacts for region 40, as will be understood by those possessing an ordinary skill in the pertinent arts.

The ridge waveguide structure may optionally be provided with passivation and/or cap layers. Further, lower cladding layer 46 of the ridge waveguiding structure may be coupled to an upper surface 30' of region 30—thereby vertically, optically coupling region 30 to region 40.

Figure 2:
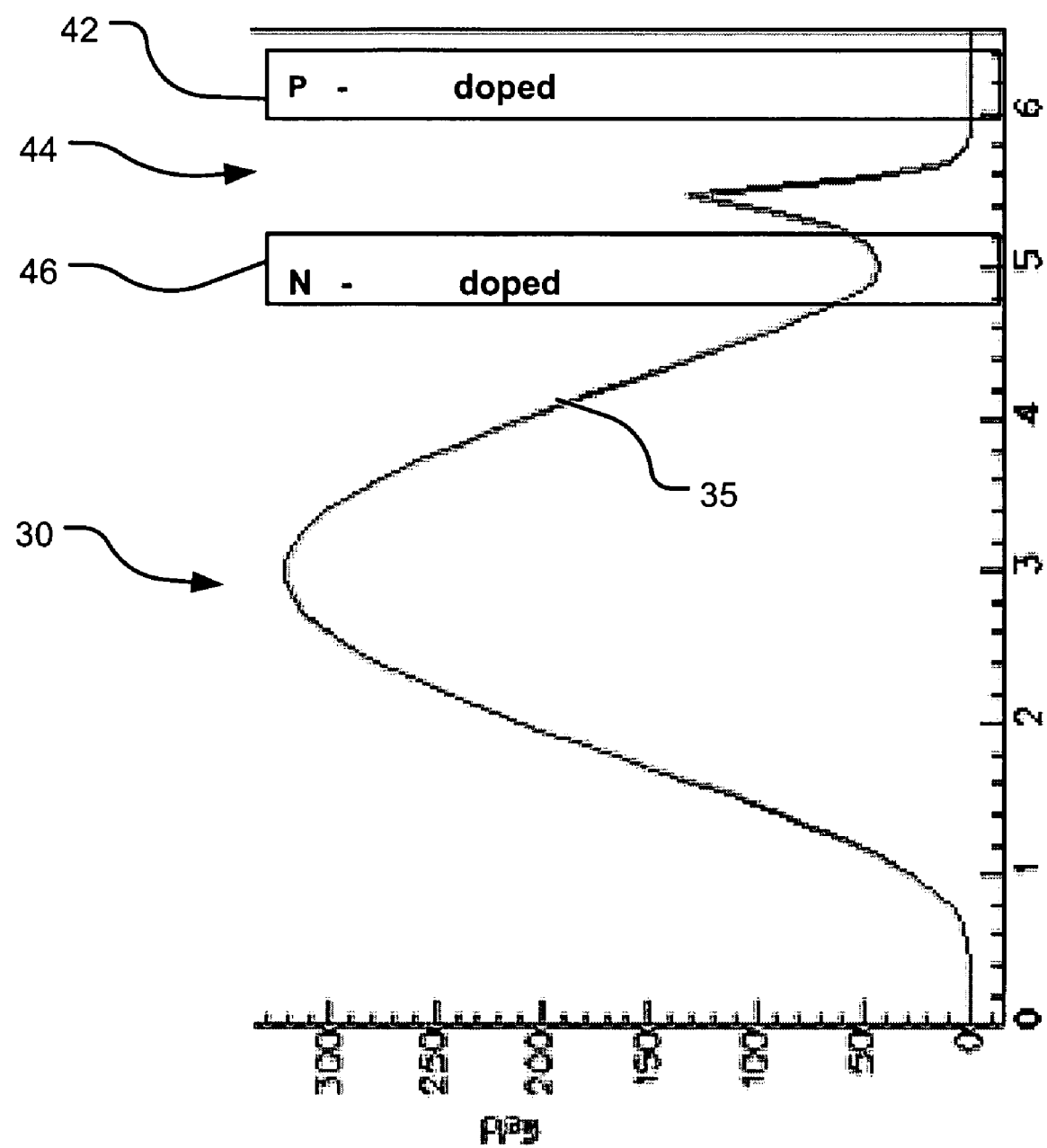
FIG. 2 illustrates a mode profile corresponding to section 2-2 of the system of FIG. 1.

Referring now also to FIG. 2, there is shown an operating mode profile 35 of the amplifier system of FIG. 1 according to an aspect of the present invention. As may be seen therein, region 30 provides large-mode waveguide functionality for ridge waveguide structure 40. As may be seen, according to an aspect of the present invention a low modal overlap to doped layers (42, 46) may be provided. For example, the overlap may be less than about 0.02%. Accordingly, system 10 exhibits low optical internal loss characteristics, such as below about 0.8 cm$^{-1}$. According to an aspect of the present invention, the cladding layers (42, 46) may be highly doped, such as on the order of about $10^{18}$ cm$^{-3}$. Further, according to an aspect of the present invention, top cladding layer(s) (42) may be relatively thin, such as on the order of about 0.5 μm. As will be understood by those possessing an ordinary skill in the pertinent arts, these characteristics lead to a device exhibiting low electrical resistance, on the order of about $10^{-5}$ Ω·cm$^2$ for example, and a low temperature resistance, on the order of about 2° C./Watt·mm for example. Accordingly, a device of the present invention is suitable for use with high current injection. Thus, device 10 exhibits a high added power.

Further, as may be seen in FIGS. 1 and 2, according to an aspect of the present invention a large optical mode 35 may be provided. Thus, device 10 exhibits good coupling characteristics for optical fiber, providing for high coupling efficiencies that may be greater than about 80%, for example.

Further yet, as the majority of the optical mode of a device of the present invention propagates in an undoped material, device 10 exhibits low optical loss and low heat generation.

Figure 3:
FIG. 3 illustrates exemplary performance characteristics according to an aspect of the present invention.

Referring now also to FIG. 3, there is shown an exemplary optical intensity for an about 5 mm long structure in accordance with FIGS. 1 and 2. As is demonstrated thereby, significant amplification may be achieved through utilization of the amplifier of FIG. 1, where a first end facet 30$i$ of layer 30 is used as an input light facet and an opposite end facet 30$o$ is used as an output light facet. Optical signals input into amplifier 30 via facet 30$i$ may be amplified as they propagate longitudinally along layer 30 towards output facet 30$o$ responsively to excitation of region 40.

Figure 4B:
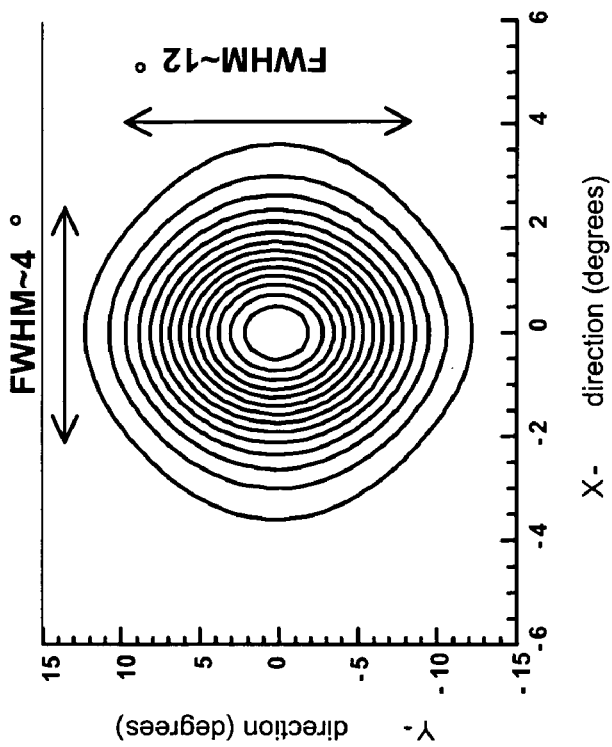
FIGS. 4A and 4B illustrate near- and far-field performance characteristics according to an aspect of the present invention; and, FIG. 5 illustrates a diagrammatic view of a system according to an aspect of the present invention.
Figure 4A:
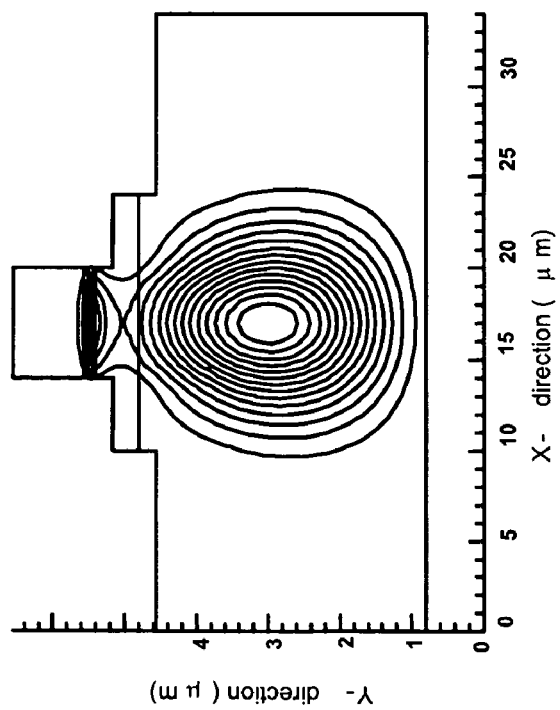

Referring now also to FIGS. 4A and 4B, an amplifier system according to the present invention may be well suited for use with optical fiber. Optical fiber may be used to deliver optical signals to amplifier 10 and receive amplified signals from amplifier 10, such as via input and output facets 30$i$, 30$o$ (FIG. 3). As is shown in FIGS. 4A and 4B, good spot size geometry is maintained by layer 30 both in the near field (i.e., nearer facet 30$i$) and far field (nearer facet 30$o$) and is well suited for use with optical fibers.

According to an aspect of the present invention, a multi-ridge system may be used to provide for enhanced amplification powers. In such a case, individual gain regions, such as in the form of system 10 of FIG. 1, may be connected in series to form a multi-ridge system, with each of the devices electrically isolated. This may advantageously provide for more even current injection in each device and reduced power fluctuation in operation. The devices may be formed monolithically, and be provided on a common substrate or separately. The devices may be coupled together using a planar waveguide or optical fiber, all by way of non-limiting example only.

Figure 5:
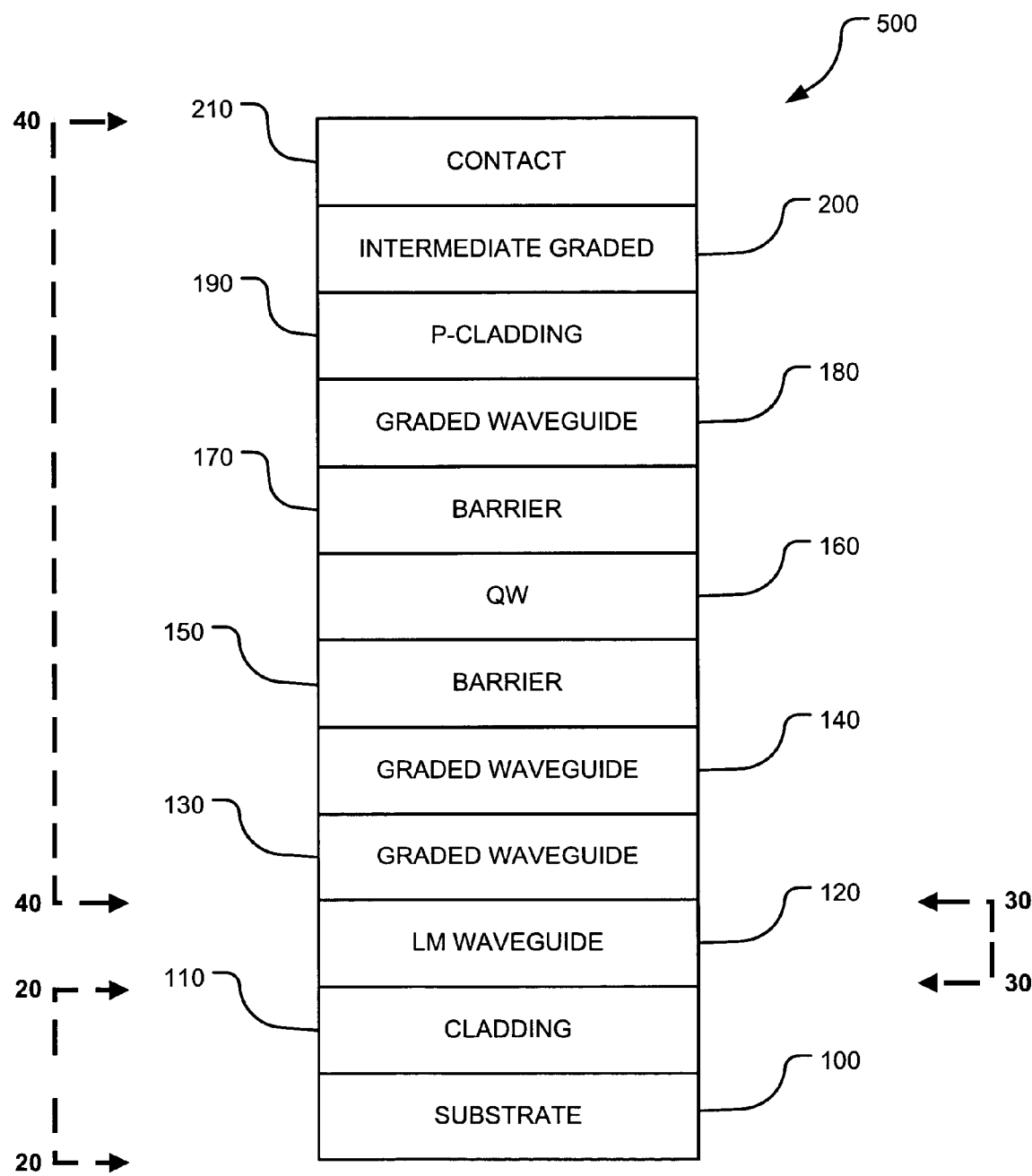

For non-limiting purposes of further explanation only, the following example may also be considered. Referring now to FIG. 5, there is shown an amplifier system 500 according to an aspect of the present invention. System 500 may include a semi-insulating substrate 100, such as a GaAs substrate. A lower cladding layer 110 may be provided upon substrate 100. Lower cladding 110 may be about 1.6 μm thick and be undoped. Lower cladding 110 may be composed of AlGaAs, and have an Al content of about 0.25%. A large-mode waveguide layer 120 may be formed over lower cladding 110. Large-mode waveguide layer 120 may be composed of AlGaAs, and have an Al content of about 0.21%. Large-mode waveguide 120 may be about 3 μm thick and also be undoped. A graded waveguide layer 130 may be provided over large-mode waveguide 120. Graded waveguide layer 130 may have an aluminum content that is graded from about 0.3 to about 0.25%. The graded layer 130 may be graded substantially linearly and transversely with respect to the layers structure, with the lower percentage nearer the quantum well(s) layer. Graded waveguide layer 130 may be about 0.3 μm thick. Graded layer 130 may be n-doped to less than about 3×10$^{18}$ cm$^{-3}$. For example, layer 130 may be doped to about 1×10$^{18}$ cm$^{-3}$. Graded waveguide 130 may be provided with an n-contact layer, composed of AlGaAs, for example. The n-contact AlGaAs may have an Al content of about 20% to about 30%, and a doping level on the order of about 10$^{18}$ cm$^{-3}$. The n-contact may have an electron mobility of at least about 1000 V/cm sec.

A graded waveguide layer 140 may be provided over layer 130. Layer 140 may be about 0.2 μm thick. Graded waveguide layer 140 may have an aluminum content that is graded from about 0.25% to about 0.2%. The graded layer 140 may be graded substantially linearly and transversely with respect to the layers structure, with the lower percentage nearer the quantum well(s) layer. Graded waveguide layer 140 may be undoped. A GaAs barrier layer 150 may be provided over graded layer 140. Barrier layer 150 may be about 10 nm thick, for example. Barrier layer 150 may be undoped. An InGaAs quantum well layer 160 may be provided over barrier layer 150. Layer 160 may have an In content of about 0.2%, and be about 7 nm thick, for example. Layer 160 may also be undoped. A GaAs barrier layer 170 may be provided over quantum well layer 160. Barrier layer 170 may be about 10 nm thick and be undoped as well. A graded waveguide layer 180 may be provided over barrier layer 170. Layer 180 may be about 0.6 μm thick. Layer 180 may be composed of AlGaAs, and have an Al content that is graded from about 0.2% to about 0.4%. The graded layer 180 may be graded substantially linearly and transversely with respect to the layers structure, with the lower percentage nearer the quantum well(s) layer. Layer 180 may be undoped. A p-cladding layer 190 may be provided over layer 180. Layer 190 may be about 1 μm thick. Layer 190 may be composed of AlGaAs, and have an Al content of about 0.4%. Layer 190 may be p-doped to about 2×10$^{18}$ cm$^{-3}$. An intermediate graded layer 200 may be provided over layer 190. Layer 200 may be about 200 nm thick. It may be composed of AlGaAs, and have an Al content that is graded from about 0.4% to about 0%. Layer 200 may be graded substantially linearly and transversely with respect to the layers structure with the higher Al content nearer the quantum wells layer. Layer 200 may be p-doped to about 2×10$^{18}$ cm$^{-3}$. Finally, a contact layer 210 may be provided over layer 200. Layer 210 may be about 50 nm thick. Layer 210 may be composed of GaAs and be p-doped to about $10^{19}$ cm$^{-3}$.

The layers 100-210 may be provided and shaped using conventional processing methodologies suitable for use with the materials thereof, such as deposition and etching for example. According to an aspect of the present invention, one may precisely control the Al content of layer 120 to provide for good waveguiding and amplification properties. For example, it may prove important to control the Al content to within about 1% of the target content.

According to an aspect of the present invention, layers 100, 110 may be suitable for use as substrate 20 of FIG. 1. Layer 120 may be suitable for use as region 30 of FIG. 1. Finally, layers 130-210 may be suitable for use as region 40 of FIG. 1.

It will be apparent to those skilled in the art that various modifications and variations may be made in the apparatus and process of the present invention without departing from the spirit or scope of the invention. Thus, it is intended that the present invention cover the modification and variations of this invention provided they come within the scope of the appended claims and their equivalents.

What is claimed is:

1. A monolithic light amplification system comprising:
   an un-doped waveguide region devoid of quantum well structure;
   a ridge waveguide region positioned over said un-doped waveguide region;
   at least one quantum well structure formed only in said ridge waveguide region; and
   at least a doped layer between said un-doped waveguide region and said ridge waveguide region; wherein, said un-doped waveguide region and said ridge waveguide region cooperate to amplify light present in a fundamental optical mode supported by the combination of said ridge waveguide region and said un-doped waveguide region.

2. The system of claim 1, wherein said un-doped waveguide region comprises AlGaAs.

3. The system of claim 1, wherein said AlGaAs of said un-doped waveguide region has an Al content of about 0.21%.

4. The system of claim 3, wherein said ridge waveguide region comprises InGaAs.

5. The system of claim 2, wherein said doped layer comprises n-AlGaAs.

6. The system of claim 5, wherein said n-AlGaAs of said doped layer has an Al content of between about 0.3% and 0.25%.

7. The system of claim 5, wherein said n-AlGaAs is doped on the order of $1\times10^{18}$ cm$^{-3}$.

8. The system of claim 1, further comprising a cladding positioned over said ridge waveguide region.

9. The system of claim 1, further comprising a p-cladding positioned over said ridge waveguide region.

10. The system of claim 9, wherein said p-cladding comprises p-AlGaAs.

11. The system of claim 10, wherein said at least one doped layer comprises n-AlGaAs.

12. The system of claim 11, wherein said cladding and said doped layer are doped.

13. The system of claim 11, wherein said cladding and at least one doped layer are doped on the order of $1\times10^{18}$ cm$^{-3}$.

14. The system of claim 1, further comprising input and output facets optically coupled to said un-doped waveguide region.

15. The system of claim 14, wherein said un-doped waveguide region provides for an amplified optical mode well suited for being coupled to an optical fiber via said output facet.

\* \* \* \* \*